Figure 1:
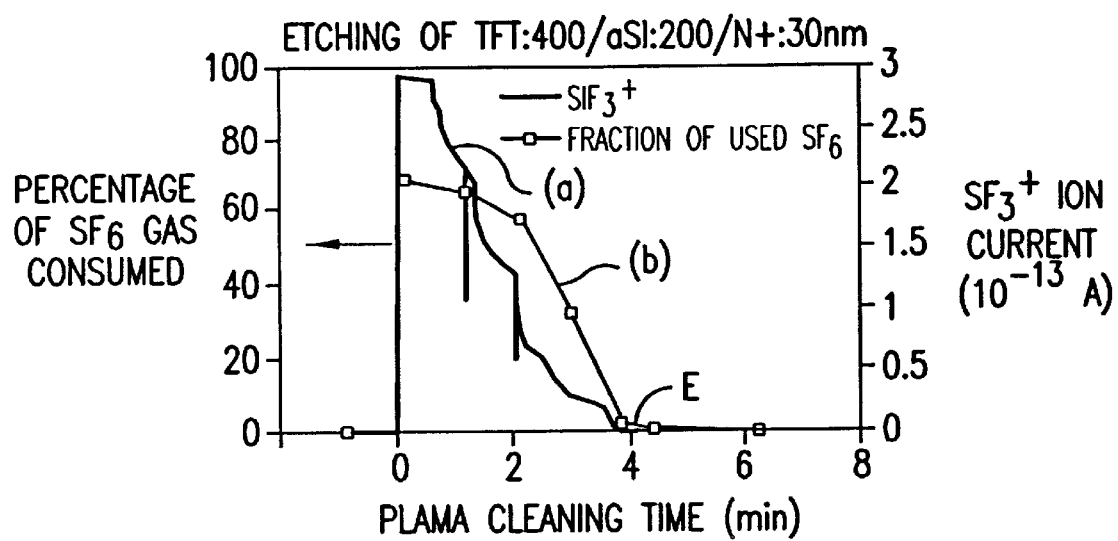

United States Patent

Turlot et al.

[11] Patent Number: 6,127,271
[45] Date of Patent: Oct. 3, 2000

[54] PROCESS FOR DRY ETCHING AND VACUUM TREATMENT REACTOR

[75] Inventors: Emmanuel Turlot, Villebon; Jacques Schmitt, La Ville du Bois; Philippe Grousset, Les Ulis, all of France

[73] Assignee: Balzers Hochvakuum AG, Truebbach, Switzerland

[21] Appl. No.: 09/066,978

[22] Filed: Apr. 28, 1998

[51] Int. Cl.⁷ .............................. E03C 1/244; B44C 1/22; C03C 25/06
[52] U.S. Cl. .............................. 438/690; 438/9; 438/698; 438/706; 438/710; 438/720; 438/905; 438/935; 252/79.1; 252/79.3; 216/37; 216/58; 216/59; 216/67
[58] Field of Search ................................ 438/9, 690, 698, 438/706, 710, 720, 905, 935; 252/79.1, 79.3; 216/37, 58, 59, 67

[56] References Cited

U.S. PATENT DOCUMENTS

| | | | |
|---|---|---|---|
| 5,211,790 | 5/1993 | Tatsumi | 156/662 |
| 5,310,456 | 5/1994 | Kadomura | 156/657 |
| 5,474,650 | 12/1995 | Kumihashi et al. | 156/643.1 |
| 5,515,986 | 5/1996 | Turlot et al. | 216/71 |
| 5,693,238 | 12/1997 | Schmitt et al. | 216/67 |
| 5,814,564 | 9/1998 | Yao et al. | 438/723 |
| 5,882,424 | 3/1999 | Taylor et al. | 134/1.1 |

FOREIGN PATENT DOCUMENTS

| | | |
|---|---|---|
| WO 99/ | 1/1999 | WIPO . |
| WO 99/08805 | 2/1999 | WIPO . |

*Primary Examiner*—Samuel A. Acquah
*Attorney, Agent, or Firm*—Evenson McKeown Edwards & Lenahan P.L.L.C.

[57] ABSTRACT

A process for dry etching a surface within a vacuum treatment reactor includes evacuating the reactor, generating a glow discharge within said reactor, feeding a reactive etching gas into said reactor and reacting said etching gas within said reactor, removing gas with reaction products of said reacting from said reactor and installing an initial flow of said etching gas into said reactor and reducing said flow after a predetermined time span and during said reacting. The vacuum treatment reactor has a reactor with a pumping arrangement for evacuating the reactor. A glow discharge generating arrangement is connected to an electric power supply. A gas tank arrangement is connected to the reactor and has a reactive etching gas such as $SF_4$.

8 Claims, 6 Drawing Sheets

PROCESS FOR DRY ETCHING AND VACUUM TREATMENT REACTOR

FIELD OF THE INVENTION

The present invention is directed on dry etching techniques.

BACKGROUND OF THE INVENTION

Dry etching uses a low pressure glow discharge to remove a thin solid surface deposition, be it of a film on a workpiece, as on a wafer, as a part of a production procedure of such workpiece or from a reactor vessel for cleaning purposes. The glow or plasma discharge is supplied with a given flow of an etching gas. The etching gas molecules are thereby rich of an etching element, such as of Fluorine, sometimes Chlorine or even more complex species. Upon dissociation of the etching gas in the discharge, etching radicals are formed. These radicals react on the surface with the depositions thereon to be removed to turn it into a gaseous product which is then removed from the reactor by pumping.

Other gases are usually added to the etching gas in order to optimise the etching process, such as oxygen as shown in table 1.

There are many reasons for such additive gases, as e.g.:
limiting the contamination of the reactor by etching by-products, as e.g. by S from $SF_6$ etching gas;
improving the selectivity for etching different material surfaces, as e.g. one film to be etched and one to remain unetched;
adjusting the relative etch rate for two different material surfaces to be etched, as e.g. of two films;
improving uniformity of the etching rate along the surface to be treated.

In Table 1 some examples of known dry etching processes are listed.

TABLE 1

| Etching | Radical | Solid | Out Carrier | Comments |
|---|---|---|---|---|
| $SF_6$ | F | Si | $SiF_4$ | Preferably with a little Oxygen |
| $SF_6$ | F | $Si_3N_4$ | $SiF_4$, $N_2$ | Preferably with a little Oxygen |
| $NF_3$ | F | $Si_3N_4$ | $SiF_4$, $N_2$ | No need for Oxygen |
| $CCl_4$ | Cl | Al | $AlCl_3$ | Oxygen forbidden |
| $C_2F_6$ | F, $CF_3$ | $SiO_2$ | $SiF_4$ | Needs ion bombardment |

Dry etching is most commonly used to pattern thin films partially protected by a resist film. The resist film is usually deposited by a photolitographic procedure, in particular for manufacturing of integrated circuits.

Nevertheless, the present invention was specifically developed for the application of reactor cleaning of especially PECVD reactors. Nevertheless, the invention can apply to dry etch cleaning of other reactors and to dry etching of workpieces in context with their manufacturing processes. This is particularly true for dry etching applications in the field of wafer processing.

PECVD is used to deposit a thin film on a substrate. A reactive gas is introduced in a low pressure reactor, wherein a glow discharge is sustained. The reactive gas is dissociated and the interesting by-product deposits as a solid film on all the exposed surfaces, thus on the inner surfaces of the reactor itself and on the substrate to be coated. When the desired thickness on the substrate is achieved, the glow discharge is stopped and the coated substrate removed. Thus, at the end of the coating process, not only the substrate is covered but all the reactor wall surfaces exposed directly or indirectly to the glow discharge are coated as well.

The phenomenon that after workpiece coating within a reactor the reactor walls are also coated is not unique for PECVD, but is also known from other coating processes, as e.g from sputtering, evaporation, as by cathodic arc, electron beam or crucible heating.

The typical applications of PECVD, to which the present invention does particularly apply, are related to electronics, optics and opto-electronics. A non-exhaustive list of examples of PECVD film manufacturing and of their application is given in table 2.

TABLE 2

| Film name | Content | Starting gas | Typical applications |
|---|---|---|---|
| Amorphous silicon | $SiH_x$ | $SiH_4$ | Thin Film Transistors, Photodiodes |
| Alloys | SiGe, SiC | $+GeH_4$, $CH_4$ | Lower gap or higher gap semicon. |
| Doped a-Si:H | $SiP_x$, $SiB_x$ | $+PH_3$, $B_2H_6$ | Electric contacts |
| Silicon Nitride | $SiN_xH_y$ | $+NH_3N_2$ | Insulator, TFT gate, Barrier |
| Silicon oxide | $SiO_xH_y$ | $SiO(CH_3)_x + N_2O$ | Insulator, TFT gate, Barrier |
| Methylpolysilane | $Si(CH_3)_x$ | $SiH_x(CH_3)_y$ | Photosensitive resist layer |
| Oxynitride | SiNxOy | $+N_2O + NH_3$ | Higher index glass |
| Fluoroxide | SiFxOy | SiF4 + N2O, etc. | Lower index glass |

In the present context one should clearly distinct the coating process, as especially PECVD coating, and the dry etching process, to which the present invention is directed specifically, but in context with previous coating too.

It should be noted that most applications of PECVD films are very sensitive to dust contamination, which is nevertheless not unique for PECVD depositions. Often, and particularly for PECVD processes, the risk of contaminating the film by dust, i.e. any solid contaminants, before, during and after the layer deposition process is to be reduced to the lowest possible level. As shown in Table 2, relevant films deposited by PECVD are silicon-based. Thereby, a corresponding dry etching process for cleaning the reactor should be Fluorine-based. Because the reactor shall not be corroded by such dry etch cleaning, it should resist to Fluorine and is thus made of Fluorine-resisting material, such as of Ni or and especially of aluminum.

If after layer deposition the reactor is not cleaned and subsequently an uncoated substrate is loaded in that uncleaned reactor so as to be coated, there are two annoying consequences:

The reactor walls for the second and for subsequent runs are different from the previous runs, due to reactor wall coating. Thus, the properties of the coating deposited on the substrate may vary from run to run.

The coatings especially deposited in PECVD are usually hard and brittle. Hence, such films deposited on the reactor walls, when cumulating, will build up stress and will crack and flake off. It is very well known by the amorphous silicon related industry, that periodic cleaning, ideally after every coating run, is mandatory to keep a good yield and to avoid particle contamination of the layer deposition process.

Such mandatory reactor cleaning is far more conveniently realised by dry etching process than by manual cleaning. Therefore, especially in this field, dry etch cleaning has become most common.

After such a dry etch cleaning, all the deposits due to previous coating deposition, and particularly PECVD deposition, must be removed. Should a thin layer remain even in a remote corner of the reactor, then, when cumulating the cycles, that film layer will also cumulate until some pealing or flaking will generate a severe particle contamination in the reactor. As a consequence, it is very important that the cleaning process lasts until the very last hidden corner of the reactor is accurately cleaned.

During the etching operation, a coating reactor and specifically a PECVD coating reactor is ineffective with respect to coating production. Hence, in order to maximise the equipment throughput, the etch cleaning times should be as short as possible and hence the etching rate should be as large as possible.

Most of the gases involved in dry etching processes are potentially harmful to the environment. Unstable molecules are usually very toxic and corrosive. More stable molecules, if they are released in the environment, can affect the Infra Red transparency of the atmosphere and contribute to global warming, as does fossil fuel combustion ($CO_2$) and agriculture development ($CH_4$). Therefore, any industrial processing system should be minimised with respect to rejects to the atmosphere.

Mostly, dry etching systems and especially vacuum reactor cleaning systems do have downstream the processing reactor and the pump arrangement a scrubbing systems, so as to eliminate potentially harmful gases from the exhaust gas mixture.

Thus, the electronic industry is optimizing its processes, not only for the best performance of the devices to be manufactured and not only for the lowest costs thereof, but also for the lowest possible environmental impact of the manufacturing activities.

If industrial gases released to the environment are stable enough to accumulate in the atmosphere, then they can alter the whole equilibrium of the atmosphere. Two well-know examples:

Destruction of the Ozone layer, global warming.

As Ozone destruction is known to be mostly related to Chlorine containing molecules and the present invention is based on the common use of Fluorine etching gases, we concentrate only on global warming.

The driving mechanism of global warming is related to the fact that industrial gas molecules are transparent to the visible incoming spectrum of the sun radiation and are opaque to the Infra Red, outgoing radiation from the earth surface. The normal constituents of the atmosphere, $N_2$, $O_2$, Ar, are transparent to the Infra Red. If the atmosphere becomes partially opaque to the Infra Red, typically in the 5 to 20 $\mu$m wave length range, global warming takes place.

For a given gas, what defines its contribution to the atmospheric Infra Red opacity, is the product of two key parameters, namely of concentration and of Infra Red absorption cross-section.

The Infra Red absorption cross-section of a given molecule is related to its structure. In short, a molecule is active if it has many non-symmetric chemical bounds. For example $SF_6$ and $C_2F_6$ are active, while $F_2$ is not active.

The concentration of a given molecule in the atmosphere is a result of two opposite mechanisms: The released amount of this gas in the atmosphere and the destruction of this molecule due to chemical reaction with any constituent of the earth surface. This degradation mechanism is summarised in one parameter, namely the atmospheric life time, giving the time scale for the molecule to be eliminated from the atmosphere. Thus, the concentration key parameter is a function of yearly release and of atmospheric life time.

The atmospheric life time of a molecule is thereby very much related to the reactivity of this molecule. Indeed, if a molecule is very passive, it will survive in the atmosphere for a very long time, and, most likely, it will be very safe in handling, because unable to react with biological molecules. On the contrary, if a molecule is reactive, it will not accumulate in the atmosphere, but will be unsafe, and in the worst case of reactivity even be difficult to keep in storage because of corrosion of storage container and piping.

Therefore, and in view of lowering atmospheric life time, there is a trade of industrial gases used be in favour of moderately chemically active molecules. Indeed, if they are active enough, they will on one hand not risk to build up in the atmosphere, but will raise serious safety handling issues, particularly when handled at high pressure.

With respect to the yearly release as one parameter of IR opacity, it is required that the quantity of released gases remains as low as possible. Combinations of gas scrubber, burner and washer will have to be installed at the exhaust of dry etching process equipment, and increasingly severe thresholds for concentration in rejected gas will be established, in particular for gases with a large potential global warming impact, i.e. of the product of Infra Red cross-section and of atmospheric life time.

Therefore, exhaust gas treatment is becoming a significant fraction of the dry etch processing, and thus significantly contributes to the costs of the equipment. The more etching gas is allowed to flow through the exhaust of a system, the larger will be the load for a downstream gas treatment system.

If the exhaust gases are highly diluted in passive gas, the destruction of the minority component will cost more. The scrubbing system will have to be much larger in volume to keep the necessary reaction time within the scrubber, heat will have to be wasted (and later cooling) for treating all the background gas together with the minority components.

Very reactive molecules are easily destroyed in a scrubbing system. On the other hand, stable molecules are difficult to eliminate. For example $CP_4$ must be burned in an oxidising atmosphere at a very high temperature in order to be destroyed. It is also very difficult to ensure a very low concentration of $CF_4$ at the scrubber exhaust.

SUMMARY OF THE INVENTION

It is an object of the present invention to realise a process for dry etching which is apt to significantly reduce contribution to atmospheric IR opacity. Thereby, it is one object of the present invention to reduce yearly release of etching gas to the environment. This is inventively realised by a process for dry etching a surface within a vacuum treatment reactor, which process comprising evacuating the reactor;

generating a glow discharge within the reactor;

feeding a reactive etching gas into the reactor and reacting said etching gas within said reactor;

removing gas with reaction products of said reacting from the reactor, and further comprising the step of installing an initial flow of the etching gas into the reactor and reducing the flow thereafter during said reacting.

Under this aspect the present invention departs from the recognition that in a dry etching, and especially in a dry etch cleaning, process, once the glow discharge is started and the etching gas is fed into the reactor, the surface depositions to be dry etch removed are first removed at a substantially constant rate. Thereafter, the rate of surface depositions removed gradually decreases. In this time span the fraction of unconsumed etching gas removed to the exhaust increases. Opening a reactor being dry etch cleaned during this time span has shown that the reactor was then only partially clean, the relatively large surfaces being still covered by surface depositions to be removed.

The origin of this second phase is the non-uniformity of the cleaning process. It is to be noted that this non-uniformity combines the thickness variations of coating deposition previously realised in the reactor, especially by PECVD, which is designed to optimise deposition uniformity on the substrate, and not elsewhere, and of local etching rate variations. This second phase of dry etching and especially of dry etch cleaning cycle can represent a significant fraction of the total dry etching time, this fraction varying depending on the manufacturing process used previously for layer deposition. This second period, whereat the fraction of unconsumed etching gas removed towards the exhaust increases, may vary from one third to nearly two thirds of the total dry etching cycle time. Towards the end of this second phase, the fraction of unconsumed etching gas turns quite abruptly constant.

As checked by opening then the reactor, no visible surface deposition is left in the reactor, precisely when the fraction of unreacted gas turns constant. Nevertheless, an extra cleaning period is added to perfect removal of any residuals in hidden corners of the reactor. The length of this required additional period depends on the details of the reactor design and on the particular coating deposition process previously performed therein. Usually, this extra time is in the order of 10% of the total dry etch cleaning time.

Thus, under this object the present invention proposes that the amount of etching gas necessitated for the dry etching cycle is significantly reduced by reducing the inflow of that gas after a first dry etching period, whereat constant etching gas flow is maintained. By reducing the flow of etching gas in the second cycle period, no reduction of etching effect is caused, but a significant reduction of unconsumed etching gas flown to the exhaust is achieved.

Still under the first object of the invention, it is a further object thereof to significantly reduce the atmospheric life time of dry etching gas. This is accomplished by a process for dry etching a surface within a vacuum treatment reactor, which comprises evacuating the reactor;

generating a glow discharge within the reactor;

feeding a reactive etching gas into the reactor and reacting the etching gas within the reactor;

removing gas with reaction products of said reacting from said reactor and further comprising the step of providing $SF_4$ within said etching gas.

Under this second aspect, the present invention departs from the recognition, that due to its chemical reactivity $SF_4$ will have very little global warming impact due to short atmospheric life time and that it will be easily and efficiently destroyed in a scrubber. It has inventively been recognised that $SF_4$ is perfectly able to do etching, especially of silicon and silicon-based compounds at a competitive etching rate and without any adverse effects, such as chemical contamination of a film processed and/or of the reactor walls.

It is still a further object of the present invention to propose a dry etching process with most significantly reduced negative effect on IR opacity in the atmosphere by reducing, in combination, the amount of etching gas removed from a reactor under dry etch operation and reducing the atmospheric life time of such etching gas removed from the reactor, thus reducing both parameters contributing to concentration of etching gas in the atmosphere.

As the amount of unconsumed dry etching gas removed from the reactor under dry etching operation is significant for the reduction of etching gas flow to the reactor without negatively affecting the etching process, it is further proposed to monitor the contents of the gas removed from the reactor and to control the inventively established reducing of unreacted reactive gas flown to the reactor as a function of the contents monitored.

In a preferred mode of operating dry etching and especially dry etch cleaning with $SF_4$, it is preferred to provide the etching gas to consist at least predominantly of $SF_4$.

A most significant reduction of etching gas used is achieved in a plant wherein the reactor is a PECVD reactor and thereby preferably one reactor of a multitude of parallel operated PECVD reactors for batch treating workpieces by a PECVD coating operation, as shown and described in the DE-A-44 12 902 or 44 12 915 and the corresponding U.S. Pat. Nos. 5,693,238 and 5,515,986, both being integrated to the present description by reference as showing multi PECVD reactor structures.

The inventive process under all its aspects may be used for dry etching surfaces of substrates in a manufacturing process, but is especially applied for cleaning surfaces, which are the inner surfaces of a reactor.

Thereby, the inventive processes are especially applied for dry etching surfaces with carbon-based, silicon-based surface depositions or with depositions which are based on refractory metal such as on W, Ta, Mo, whereby $SF_4$-containing etching gas is especially suited for etching silicon-based surface depositions.

In a preferred mode of operating the dry etching process by inventively applying an etching gas consisting at least essentially of $SF_4$, Oxygen is added.

A vacuum treatment reactor which resolves the object with respect to reduction of etching gas used throughout the etching cycle comprises at least one glow discharge generating arrangement connected to an electric power supply, a gas inlet connected to a gas tank arrangement containing a dry etching gas or gas mixture via a controllable flow controller and further comprises a control unit, the output thereof being operationally connected to the control input of the flow controller and generating an output signal controlling the flow controller to decrease the gas flow from said tank arrangement to the reactor during a predetermined time span within a predetermined dry etching cycle time.

Under the aspect of contributing to reduction of atmospheric life time of a dry etching gas, there is proposed a vacuum treatment reactor which comprises a pumping arrangement for evacuating the reactor and a glow discharge generating arrangement connected to an electric power supply, a gas tank arrangement connected to the reactor and comprising a reactive etching gas wherein the reactive etching gas comprises $SF_4$.

Further preferred embodiments of the inventive process and vacuum treatment reactors are specified in the dependent claims.

SHORT DESCRIPTION OF THE FIGURES

Figure 2:
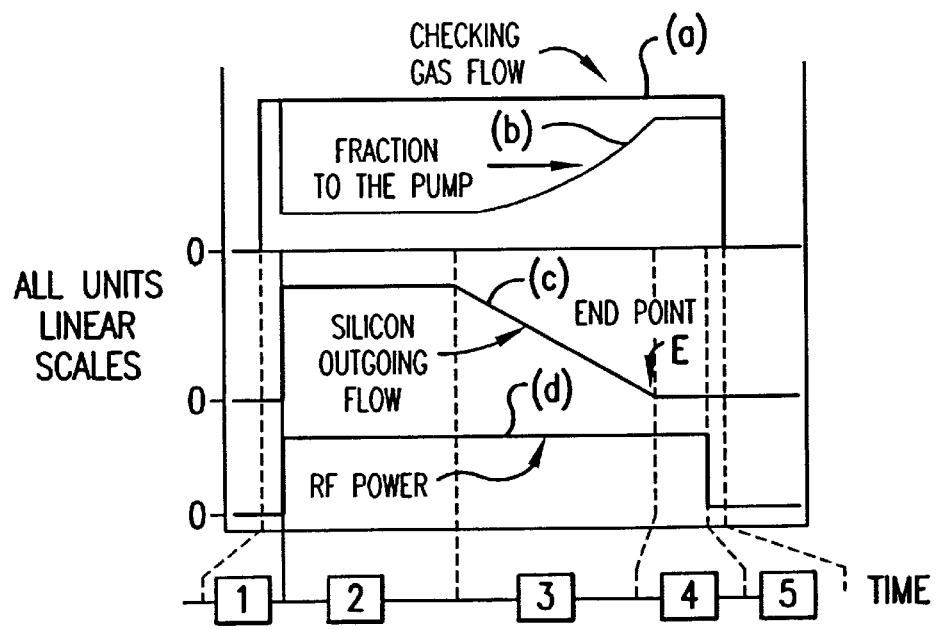
Figure 3:
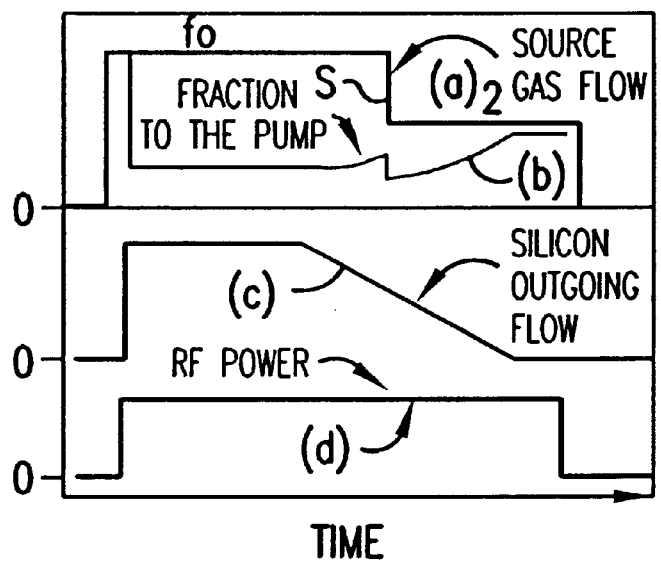
Figure 4:
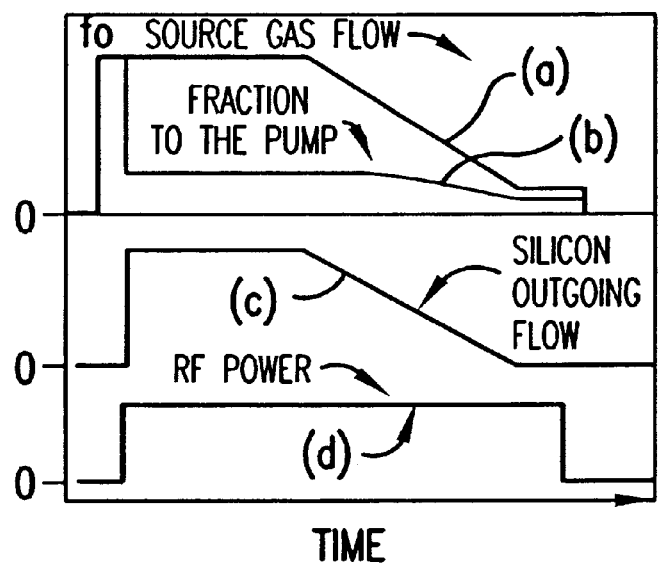
Figure 5:
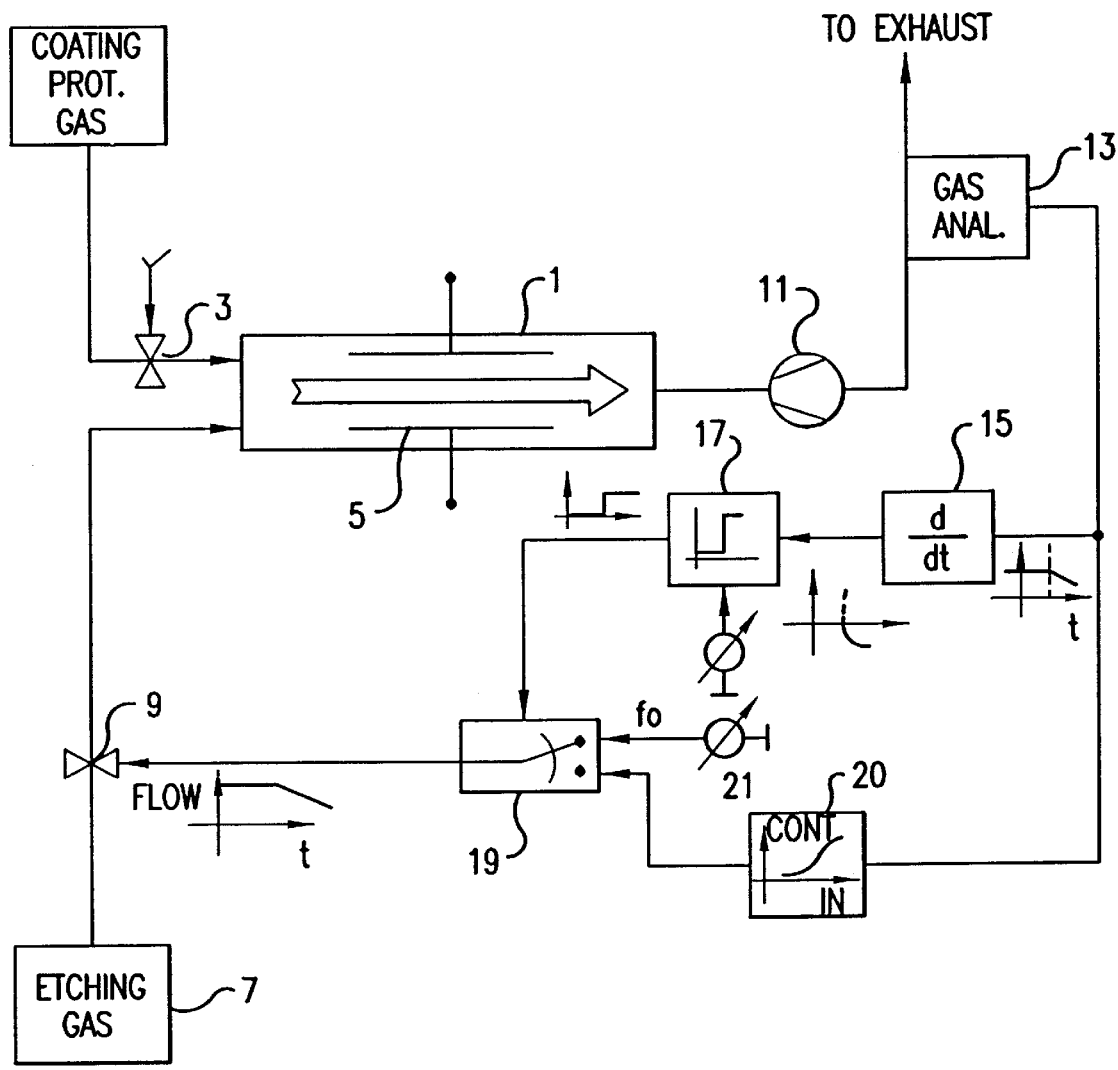
Figure 6:
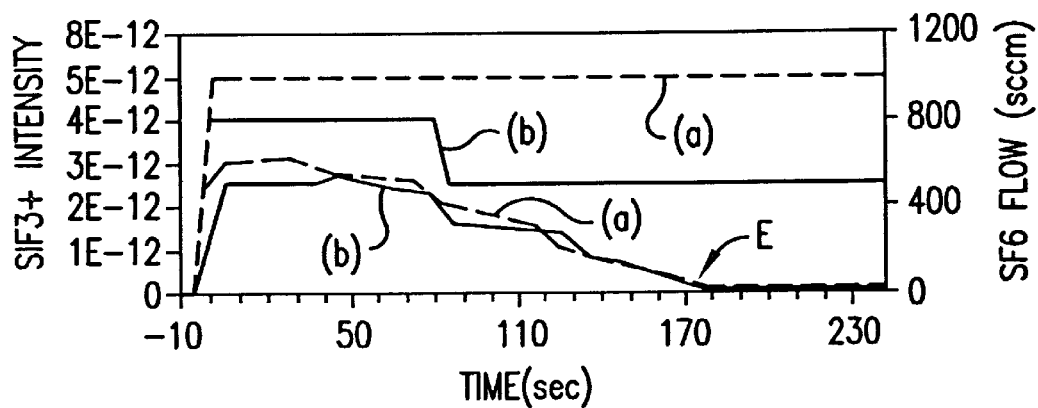
Figure 7:
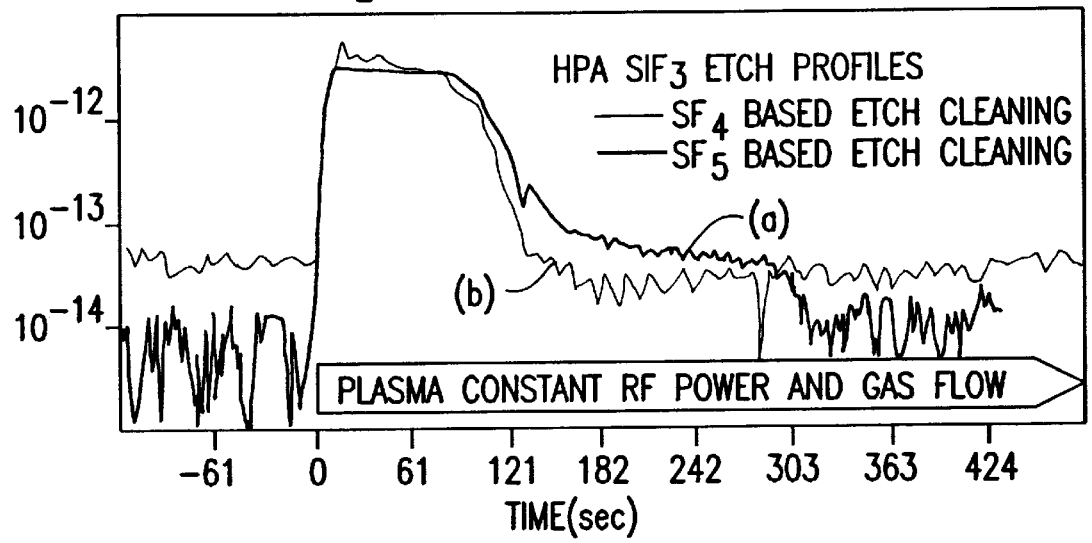
Figure 8B:
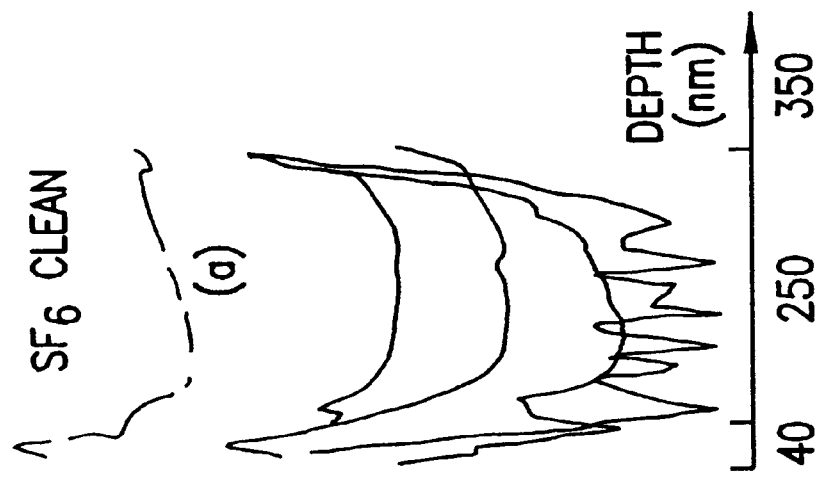
Figure 8A:
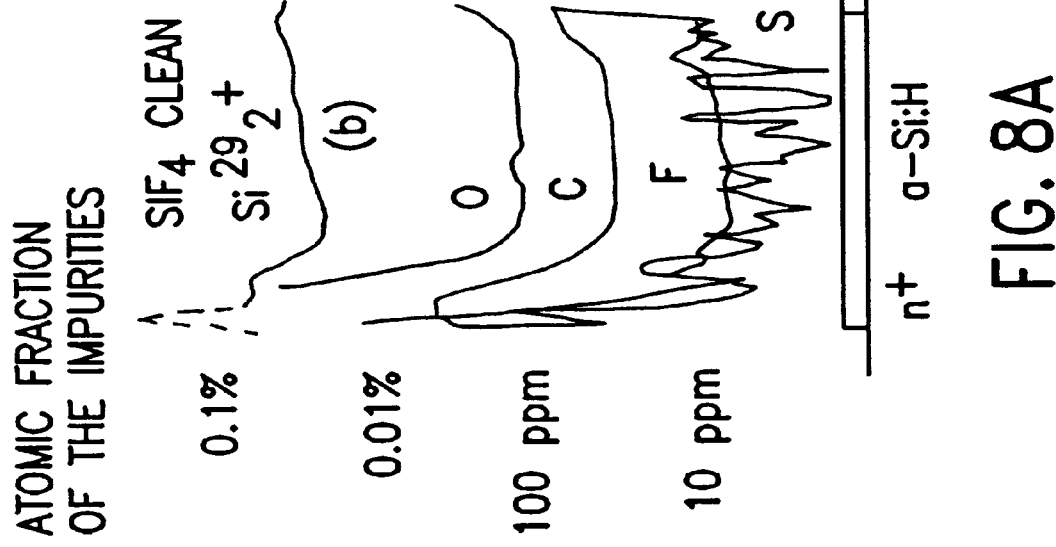
Figure 9:
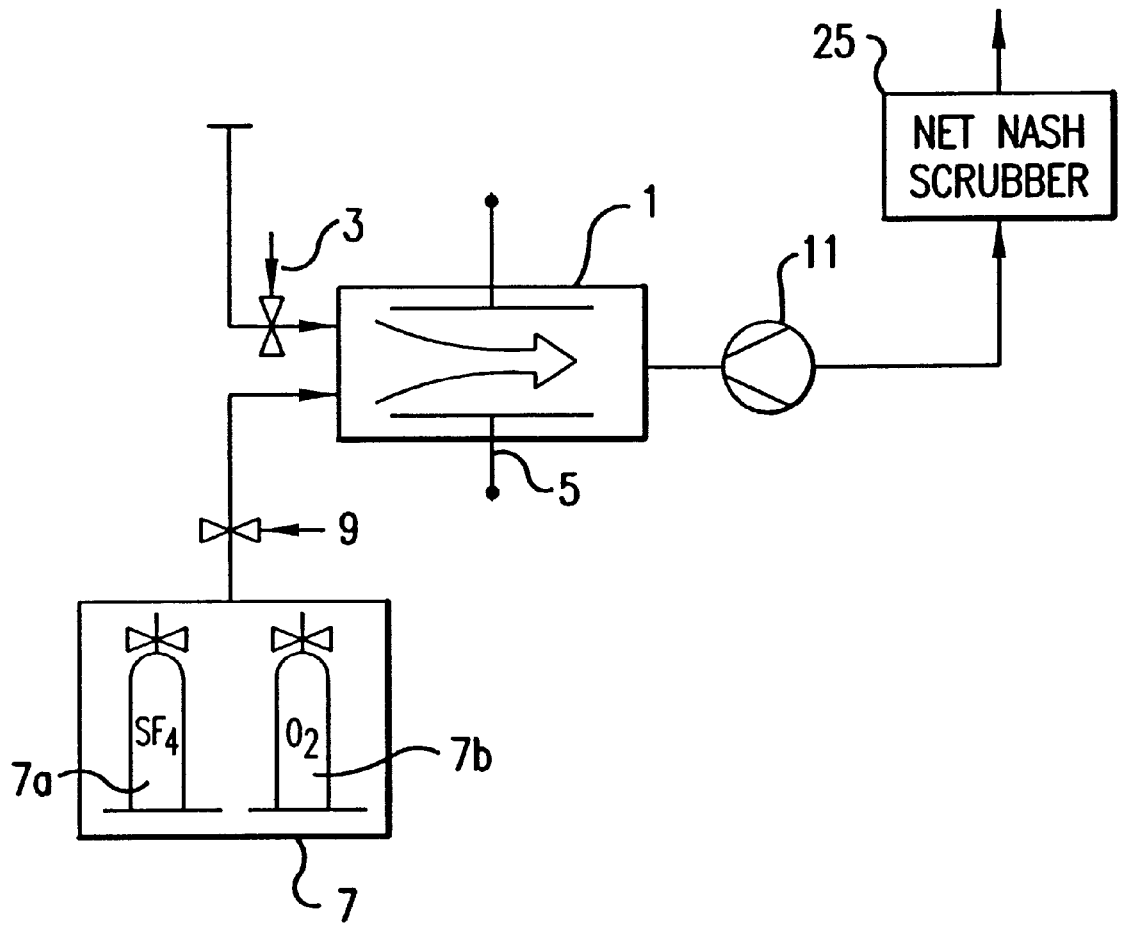

The present invention will now be further described with the help of figures, which as examples show:

FIG. 1 over dry etching time the course (a) of consumed etching gas $SF_6$ in % of a constant flow to the reactor under dry etch cleaning, and (b) the course of a gas concentration with etch-removed component, $SiF_3^+$;

FIG. 2 over process time, the course (a) of inlet fresh etching gas and (b) of unconsumed etching gas exhausted; the course of etch-removed silicon (c); the time course of Rf-power of the plasma discharge (d), as recognised at a customary dry etch cleaning process and as a basis recognition for the present invention;

FIG. 3 in a representation in analogy to that of FIG. 2, courses (a) to (d) as a result of the inventive process in a first realisation form;

FIG. 4 in a representation according to the FIGS. 2 or 3 the courses (a) to (d) realised by a further form of realisation of the inventive process;

FIG. 5 schematic, an inventive vacuum treatment reactor in a first embodiment;

FIG. 6 as a comparison, the resulting courses of etching removal with standard constant inflow of reactive gas (a) with inventive step flow reduction (b);

FIG. 7 comparison results of dry etch cleaning with customarily used $SF_6$ (a) and with the inventively used $SF_4$, shown by the concentration of etched material containing gas;

FIG. 8 comparison results of remaining impurities on thin film transistors (TFT) deposited in a PECVD system just after etch cleaning with $SF_6$— (a) and $SF_4$-based etching gas;

FIG. 9 schematic, a second inventive vacuum treatment reactor.

FURTHER DETAILED DESCRIPTION OF THE INVENTION

Let's resume the requirements of dry etching processes:

Limitation of unconsumed etching gas delivered to process exhaust.

The etching gas should be turned into a gaseous carrier of the surface deposition to be etched and should not be wasted unconsumed to the exhaust.

This is inventively realised by decreasing the flow of unconsumed dry etching gas to the vessel under dry etching operation.

Elimination of stable by-products. After crossing the plasma, the etching gas is transformed into many by-products. If one of them is a stable molecule harmful to the environment and difficult to destroy, the process will lead to not acceptable rejects or will load the system costs with sophisticated scrubbing. As an example Fluorine-Carbon, as $C_2F_6$ or $C_3F_6$ can produce, when processed by a plasma, relatively large amounts of $CF_4$ which is difficult to eliminate.

This requirement is fulfilled by inventively using a dry etching gas which is based on $SF_4$.

Selection of a moderately stable etching gas molecule.

The best choice for a Fluorine etching gas is inventively the moderately reactive molecule of $SF_4$. This etching gas thereby fulfils the requirements to be industrially available and of low cost.

Sufficient etch rate for industrial application. The potential of a given Fluorine etching gas for rapid dry etching is difficult to predict.

Experimental analysis, the only safe approach, has shown that the inventively used $SF_4$ does provide clearly sufficient etching rates. Thereby, the inventively used $SF_4$ does not lead to potential solid deposits as of Metal-Fluorides, such as $WF_6$, $TQF_5$. The inventively exploited $SF_4$ provides a not too stable molecule, and the plasma discharge does provide enough dissociation energy for such gas, whereas more stable molecules would consume more discharge power from the plasma for equivalent results. Thus, again we meet a benefit of an etching gas lacking of stability. Up to now, gases for acceptable etching rates were $SF_6$ and $NF_3$, which are therefore and with respect to the present invention, reference gases.

Absence of contaminating residuals. Some etching gases are likely to leave unwanted residuals in the process area and thus in the reactor. This leads to long term process drift and makes frequent manual cleaning necessary. As an example $PF_6$ is not acceptable, because it induces spurious silicon doping of the processed silicon-based devices. $C_2F_6$ would lead to a Fluorocarbon polymer deposit on the reactor walls, unless a large portion of Oxygen is mixed to the etching gas at the expense of a reduced etching rate.

The inventively used $SF_4$ does not lead to more contamination residuals than does $SF_6$.

Absence of major system corrosion.

This is also an important issue fulfilled by the inventively applied $SF_4$. For example HF should be excluded from quartz-based reactors, $SF_6$ from copper- or silver-containing reactors.

In FIG. 1 the dry etch cleaning sequence of the standard dry etching process is analysed. Thereby, time analysis is shown of an etch cleaning process of a PECVD reactor after TFT deposition. As etching gas $SF_6$ is used. During the cleaning time a constant 100% $SF_6$ flow into the reactor is maintained, and the discharge is maintained at constant Rf power. Data are measured by mass spectrometry of gas samples from the reactor exhaust line. The course (a) shows the flow of silicon etch-removed from the reactor, as by $SiF_3^+$. The course (b) shows the fraction of consumed dry etching gas, thus of $SF_6$.

The overall plasma cleaning time is either estimated from the thickness of the surface deposition to be removed or is based on an end point measurement. In any case, the etch cleaning time is extended by an extra time to ensure that all hidden corners of the reactor are accurately cleaned for sure.

As shown in FIG. 1 the process sequence can be divided into several successive periods, which are emphasised in FIG. 2:

(1) Before the Rf plasma discharge is started, the flow of dry etching gas is installed. Obviously enough, this period where etching gas is flowing totally unconsumed through the reactor must be minimised.

(2) The plasma discharge is started. In this period the system is in a steady state, the etching gas is turned into a silicon carrier gas, the deposit material, silicon-based, is removed at a constant rate, as shown in FIG. 2(c) period Nr. 2. In this period the fraction of exhausted unconsumed etching gas and as shown by the shadowed area of FIG. 2(b) is relatively low.

(3) In a third period of the etching process cycle time, the rate of surface material removal, as of silicon removal, FIG. 2(c), decreases gradually. Accordingly, and as a function thereof, the fraction of unconsumed dry etching gas, as of $SF_6$, increases (FIG. 2(b)). Opening the reactor during this period shows that it is partially clean, some of its surfaces nevertheless being still covered with surface depositions to be removed as by silicon-based film.

The origin of this behaviour in period Nr. 3 is, as was mentioned above, non-uniformity of the cleaning process. This third period may be quite long with respect to the total cleaning cycle time. At the end of this third period a turning point E of the outflow of that gas carrying surface deposition components to be removed is encountered, as a turning point in $SiF_3^+$ ion current according to FIG. 1. As checked by opening the reactor in that time E no visible deposition or film is left in the reactor at precisely this point.

(4) This extra cleaning time span ensures perfect removal of surface depositions, as in the PECVD reactor, in hidden corners. The required length of this fourth period depends on the details of the reactor design and on the particulars of the preceding processes, as of the preceding PECVD deposition process. Usually, and at PECVD, this extra time is of the order of 10% of the total dry etch cleaning time.

(5) End of the process, where Rf power is switched off. Obviously, the etching gas flow must be switched off as well to avoid spoiling etching gas.

In the FIGS. 3 and 4 and departing from the analyses of a standard dry cleaning process according to FIG. 1 or 2, two embodiments of an inventive dry etch cleaning process are shown.

According to FIG. 3 after installing a constant initial flow of etching gas at $f_o$, the flow of etching gas is reduced. Reduction starts as soon as the gas in the exhaust shows that etching of surface depositions to be removed deceases. Nevertheless, it is not critical when the flow reduction starts as long as such reduction does not reduce the etching rate. According to FIG. 3(a) the inflow of etching gas is reduced in one step S. Again in FIG. 3(b) the shadowed area shows the fraction of unconsumed reactive gas exhausted, which fraction is significantly reduced compared with standard operation of FIG. 2(b).

In FIG. 4 the initial etching gas flow $f_o$ is steady and as shown preferably linearly decreased as soon as the exhausted gas shows a reduced etching of surface deposition to be removed. The shadowed area of FIG. 4(a) shows a tremendous reduction of spoiling unconsumed etching gas and as compared with FIG. 2(a).

Thus, and as becomes clear from FIGS. 3 and/or 4, depending on the desired reduction of spoiling unconsumed etching gas, a simple or multiple step gas flow reduction may be selected up to sophisticated tailoring of reduction time-course. It is to be noted that additionally further process parameters, as e.g. pressure in the vessel and/or Rf power, as shown in FIG. 4(d), may be varied to optimise the dry etching process, e.g. additionally with respect to power consumption in that gas flow reduction period.

Under this first aspect of the invention, and as was outlined above, when the reactor to be cleaned or a substrate surface to be dry etched is partially etched, it is useless to apply the same initial flow $f_o$ of etching gas. Thus, the gas flow may be reduced when dry etching has partially occurred without affecting the etching rate.

Thereby, the amount of unconsumed and thus spoiled etching gas is drastically reduced, which reduces on one hand costs for such dry etching gas but which does especially contribute to reduction of release of etching gas into the atmosphere under the aspect of "yearly release" at given gas cleaning efforts at the exhaust side of the reactor.

FIG. 5 shows schematically an inventive reactor which realises the inventive dry etching process as described up to now. A reactor 1, as a PECVD reactor, is connected by a controllable valve arrangement 3 to a gas tank arrangement with coating process gas, e.g. for PECVD layer deposition.

In FIG. 6 the broken lines (a) show standard constant etching gas flow at 1000 sccm as of $SF_6$ and the resulting removal of silicon-based surface depositions as indicated by the $SiF_3^+$ content in the exhaust gas.

The reactor 1 comprises a glow discharge generating arrangement, as schematically shown at 5, connected to an appropriate power supply, as to an Rf power supply (not shown)

In the reactor 1, as e.g. the PECVD reactor, substrates are PECVD coated under operation of the glow discharge and under supply of a processing gas, as controlled by controllable valve 3.

For dry etching in the reactor or for dry etch cleaning the reactor 1, a dry etching gas, as $SF_6$ or, inventively, $SF_4$, is fed to the reactor 1 from an etch gas tank arrangement 7 via a controllable valve arrangement 9.

At the exhaust side of reactor 1 with pump 11, there is provided a gas analysing unit 13, as e.g. a mass spectrometer unit, monitoring the contents of exhaust gas of the reactor 1. As soon as a decrease of etching efficiency occurs, this is detected by a differentiating unit 15 at the output of unit 13 and a comparator unit 17. Then a switching unit 19 is switched from a signal source 21 to the output of unit 13 via preferably a non-linear amplifier unit 20. Thus, before a decrease of etching efficiency is detected, valve 9 is controlled to a constant flow value according to $f_o$, set by unit 21. As soon as a decrease of etching efficiency is detected, valve 9 is controlled via amplification unit 20 as a function of the course of decreasing etching efficiency.

Thus, by such a technique it becomes possible to control the flow of etching gas to reactor 1 as a function of decreasing etching rate.

It is evident that valve 9 may be controlled by a timer and unrelated to any exhaust gas analysis, be it in steps or continuously.

The inventive process is especially suited for dry etch cleaning vacuum coating reactors, as especially PECVD reactors, thereby especially for PECVD multiple reactors for batch coating substrates. Thereby, a multitude of parallel operated PECVD reactors are parallel dry etch cleaned, so that the inventive process saves a considerable amount of dry etching gas otherwise exhausted to the ambient.

Accordingly, the inventive reactor as schematically shown in FIG. 5 is preferably a PECVD reactor to be inventively cleaned, thereby especially one of a multitude of parallel operated PECVD reactors.

The solid lines (b) show reduction of the flow of dry etching gas, as of $SF_6$, from 800 sccm in one step to 400 sccm. The resulting removal curve shows a minimal difference of etching effects. The duration of both cleaning operations is the same, namely approx. 170 seconds to point E (see FIG. 2(c)).

Under the second aspect, namely that of applying an etching gas for a dry etching process with considerably reduced atmospheric life time, it was found that $SF_4$, as an etching gas or at least an etching gas component leads to a most satisfying solution.

It is known from the chemical reactivity of $SF_4$ that it will have very little global warming impact, due to short atmospheric life time and that it will be easily and efficiently destroyable in a scrubber.

Nevertheless, it was not foreseeable that $SF_4$ would be able to do etching, especially of silicon and silicon-based compounds, at a competitive etching rate compared with known etching gases and without adverse effects, such as chemical contamination of the etched surface.

Comparative etch cleaning experiments were conducted in an industrial PECVD reactor. The results are shown in FIG. 7. Identically a-Si:H-coated reactors were cleaned with an $SF_6$-based (a) and an $SF_4$-based etching gas. The respective time courses of $SiF_3^+$ in the exhaust of the reactor is shown as a measure for Si etching rate. Rf power and etching gas flow were kept constant. As a result, it is evident, that dry etching with $SF_4$-based etching gas is at least as efficient as with $SF_6$-based etching gas. The mass 85 peak intensity—as of $SiF_3^+$—is shown in a logarithmic scale. The end point E defined according to FIG. 2 occurred approx. after the same cleaning time, for $SF_4$ after shorter time.

Further analyses of $SF_4$ etching ability has confirmed that $SF_4$ is, for etching processes, of the same type as classical atomic Fluorine etching gas, such as $SF_6$, $NF_3$ and $XeF_2$. Etching by $SF_4$ leads to all the well-known characteristics of atomic Fluorine etching gases:

rapid etching of Si (christalline and amorphous, SiN, SiC etc.);

etching of $SiO_2$ requires assistance of ion bombardment;

without other gas additive, etching of Si is isotropic.

Efficient etch cleaning with $SF_4$, as for $SF_6$, requires, that a fraction of Oxygen be added to the injected dry etching gas mixture. As for $SF_6$ etching, the role of $O_2$ is to displace Fluorine away from Sulphur in the plasma discharge and to help transporting away Sulphur as a gas ($SO_2$).

The major potential contamination risk for $SF_4$ is thereby obviously Sulphur. The danger already exists with $SF_6$, as was studied and evaluated by the electronic industry. The Sulphur residuals can be minimised by adding Oxygen to the process. $SF_6$ was judged to be satisfactory, and it is today used frequently by the industry.

However, for $SF_4$ the risk is larger because the molar fraction of Sulphur is larger per molecule (40%). Moreover, other contamination could result from unexpected by-products of the reaction of $SF_4$ with wall and/or substrate surfaces.

The most sensitive circumstance to detect post etching contamination is PECVD deposition of an electronic device just after dry etch cleaning of the reactor. Indeed, a semiconductor is deposited in the reactor and if some contamination is introduced in the material deposited, the electronic device will show degraded performance. One of the very best techniques to identify the degree of contamination of silicon is SIMS, Secondary Ion Mass Spectrometry.

We have deposited TFT in a PECVD reactor just after having etch cleaned the reactor with $SF_4$-based etching gas and, for comparison, with $SF_6$-based etching gas. The results are shown in FIG. 8. It is found that the atomic content of Sulphur in amorphous silicon is less than $5 \times 10^{16}$ cm$^{-3}$, hence less than 10 ppm (parts per million) for $SF_4$-based (b) and for $SF_6$-based previous etch cleaning of the reactor. The level of contamination for $SF_4$-based etch cleaning (b) and of $SF_6$-based etch cleaning (a) are equivalent. Both transistors were measured and found to have satisfactory electronic performances.

Thus, $SF_4$ as an etching gas has no disadvantage compared to $SF_6$ but is less stable, thus contributing less to loading the atmosphere. $SiF_4$ resulting from dry etching silicon-based surfaces with $SF_4$ is rapidly destroyed by water to form $Si(OH)_4$ and HF. Thus, a good scrubber at the reactor's exhaust can be just wet washing with alkaline neutralisation of HF.

According to FIG. 9 an inventive reactor 1 comprises an etching gas tank arrangement 7, which comprises a gas tank with $SF_4$ and preferably a gas tank with $O_2$, as shown by $7_a$ and $7_b$. Further, and as schematically shown at 25, it preferably comprises a scrubber unit for wet washing the exhaust gas in an alkaline solution. Obviously, the two inventive techniques of reducing the amount of etching gas used for a given etching process and of using $SF_4$ are combined, thus resulting in an inventive reactor, especially PECVD reactor, according to FIG. 6, whereat the etching gas tank arrangement 7 comprises storage tanks for $SF_4$ and preferably for $O_2$ and preferably with a scrubber unit as described with respect to FIG. 9.

What is claimed is:

1. A process for dry etching a surface within a vacuum treatment reactor, the process comprising evacuating the reactor;

generating a glow discharge within said reactor;

feeding a reactive etching gas into said reactor and reacting said etching gas within said reactor;

removing gas with reaction products of said reacting from said reactor;

and further comprising the step of installing an initial flow ($f_o$) of said etching gas into said reactor and reducing said flow after a predetermined time span and during said reacting.

2. A process for dry etching a surface within a vacuum treatment reactor, comprising evacuating the reactor;

generating a glow discharge within said reactor;

feeding a reactive etching gas into said reactor and reacting said etching gas within said reactor;

removing gas with reaction products of said reacting from said reactor;

and further comprising the step of providing $SF_4$ at least as a part of said etching gas.

3. The process of claim 1, wherein said etching gas comprises $SF_4$.

4. The process of claim 1, further comprising the step of monitoring at least one content of said gas removed from said reactor and controlling said reducing as a function of said content monitored, thereby performing said controlling preferably automatically.

5. The process of claim 2, further comprising the step of selecting said reactive gas to consist at least to a predominant part of said $SF_4$ and, preferably, of $O_2$.

6. The process of claim 1, wherein said reactor is a PECVD rector, thereby preferably one reactor of a multitude of parallel operated PECVD reactors for batch treating workpieces.

7. The process of claim 1, wherein said surface within said reactor is an inner surface of said reactor to be dry etch cleaned.

8. The process of claim 1, wherein said surface is to be cleaned from at least one of carbon-based, silicon-based, refractory-metal, as W-, Ta-, Mo-based surface depositions and wherein silicon-based deposition are preferably etched with said $SF_4$.

* * * * *